US009598764B2

(12) United States Patent
Shin et al.

(10) Patent No.: US 9,598,764 B2
(45) Date of Patent: Mar. 21, 2017

(54) METHOD OF FABRICATING SPUTTERING TARGET, SPUTTERING TARGET USING THE METHOD, AND METHOD OF MANUFACTURING ORGANIC LIGHT-EMITTING DISPLAY APPARATUS USING THE SPUTTERING TARGET

(71) Applicant: Samsung Display Co., Ltd., Yongin, Gyeonggi-Do (KR)

(72) Inventors: Sang-Wook Shin, Yongin (KR); Sun-Young Jung, Yongin (KR); Il-Sang Lee, Yongin (KR); Jin-Woo Park, Yongin (KR); Dong-Jin Kim, Yongin (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 352 days.

(21) Appl. No.: 14/205,624

(22) Filed: Mar. 12, 2014

(65) Prior Publication Data
US 2015/0014151 A1    Jan. 15, 2015

(30) Foreign Application Priority Data
Jul. 12, 2013  (KR) .......................... 10-2013-0082438

(51) Int. Cl.
*C04B 35/457* (2006.01)
*C23C 14/34* (2006.01)
*C23C 14/08* (2006.01)
*H01J 37/34* (2006.01)
*H01L 51/52* (2006.01)

(52) U.S. Cl.
CPC ........ *C23C 14/3414* (2013.01); *C23C 14/086* (2013.01); *H01J 37/3414* (2013.01); *H01J 37/3426* (2013.01); *H01J 37/3429* (2013.01); *H01L 51/5253* (2013.01)

(58) Field of Classification Search
CPC ............... H01J 37/3429; C04B 35/457; C04B 2235/3293; C04B 35/62665
See application file for complete search history.

(56) References Cited

U.S. PATENT DOCUMENTS

2007/0040501 A1   2/2007 Aitken et al.
2007/0272938 A1*  11/2007 Maeda ................. C04B 35/581
                                             257/99
2010/0206724 A1   8/2010 Takahashi
2012/0097205 A1*  4/2012 Iida ....................... H01M 4/383
                                             136/200

(Continued)

FOREIGN PATENT DOCUMENTS

KR    1020100047897 A    5/2010
KR    1020110052119 A    5/2011

*Primary Examiner* — Erin Snelting
(74) *Attorney, Agent, or Firm* — Cantor Colburn LLP

(57) ABSTRACT

A method of fabricating a sputtering target includes preparing a first powder material including at least one of a tin oxide and a mesh-forming oxide; mixing the first powder material and a second powder material comprising carbon or a tin oxide to prepare a mixture; simultaneously performing a primary compression and primary sintering on the mixture in a reduction atmosphere; and simultaneously performing a secondary compression and secondary sintering on the mixture in the reduction atmosphere to prepare the sputtering target.

12 Claims, 4 Drawing Sheets

(56) References Cited

U.S. PATENT DOCUMENTS

2014/0367251 A1* 12/2014 Adachi ................ B30B 11/027
204/298.12
2015/0184280 A1* 7/2015 Medvedovski ....... C04B 35/457
252/520.1

* cited by examiner

METHOD OF FABRICATING SPUTTERING TARGET, SPUTTERING TARGET USING THE METHOD, AND METHOD OF MANUFACTURING ORGANIC LIGHT-EMITTING DISPLAY APPARATUS USING THE SPUTTERING TARGET

This application claims priority to Korean Patent Application No. 10-2013-0082438, filed on Jul. 12, 2013, and all the benefits accruing therefrom under 35 U.S.C. §119, the content of which is in its entirety is herein incorporated by reference.

BACKGROUND

1. Field

One or more embodiments of the present invention relate to a method of fabricating a sputtering target, a sputtering target using the method, and a method of manufacturing an organic light-emitting display apparatus using the sputtering target.

2. Description of the Related Art

An organic light-emitting display apparatus, which is a self-luminous display device, is advantageous for having excellent luminance, driving voltage, and response speed characteristics and for being able to implement multiple colors as well as having wide viewing angles, excellent contrast, and fast response times.

An organic light-emitting display apparatus may include an organic light-emitting diode ("OLED"). The OLED may be easily deteriorated by moisture and oxygen. For this reason, an organic light-emitting display apparatus includes a sealing structure for sealing the OLED from moisture and oxygen. The sealing structure may be formed of a thin film encapsulation. The thin film encapsulation may be formed of an inorganic material, and the inorganic material may be deposited on a substrate using a sputtering method. In the case of using a sputtering method, a sputtering target becomes a negative electrode, and the substrate to be deposited becomes a positive electrode. That is, the sputtering target has a more negative charge than the substrate, and as a result, a positively charged material may accelerate toward and collide with the target to emit atoms of the target. When the material forming the thin film encapsulation is an insulating inorganic material, the sputtering target also needs to be formed of the insulating inorganic material, however such a target has a too large resistance, in other words, has a small conductivity, and thus the charge of the target may not be maintained more negative than that of the substrate. Under these circumstances, deposition of the insulating inorganic material using a sputtering method may be difficult.

SUMMARY

One or more embodiments of the present invention includes a method of fabricating a sputtering target, where the method enables deposition of an insulating inorganic material using a sputtering technique, a sputtering target fabricated using the method, and a method of manufacturing an organic light-emitting display apparatus using the sputtering target.

Additional embodiments will be set forth in part in the description which follows and, in part, will be apparent from the description, or may be learned by practice of the presented embodiments.

According to one or more embodiments, a method of fabricating a sputtering target includes preparing a first powder material including at least one of a tin oxide and a mesh-forming oxide; mixing the first powder material and a second powder material to prepare a mixture, where the second powder material includes carbon or a tin oxide (SnO); simultaneously performing a primary compression and primary sintering on the mixture in a reduction atmosphere; and simultaneously performing a secondary compression and secondary sintering on the mixture in the reduction atmosphere to prepare the sputtering target.

The preparing of the first powder material may further include preparing a raw material mixture by mixing a first raw material and a second raw material in a moisture-free environment, where the first raw material includes a tin oxide or a mesh-forming oxide and the second raw material includes at least one of a phosphorus oxide, a boron phosphate, a tin fluoride, a niobium oxide, a lead fluoride, a silicon oxide, a tungsten oxide, an indium oxide, a bismuth oxide, a zinc oxide, and a boron oxide; melting the raw material mixture in vacuum to prepare a melt; solidifying the melt; and pulverizing the melt to prepare the first powder material.

The carbon may include at least one of carbon nanotubes, conductive carbon black powder, conductive carbon fibers, graphite, and graphene.

The mixture may include 50 wt % to 99.9 wt % of the first powder material and 0.1 wt % to 50 wt % of the second powder material.

The reduction atmosphere may be formed by contacting a carbon sheet with the mixture, where contact between the carbon sheet and the mixture occurs in an upper part or a lower part of the mixture.

The reduction atmosphere may be formed in a container comprising the mixture, where the container further includes carbon.

The primary sintering and the secondary sintering may be performed as the container is heated using a high frequency induction heating technique.

The primary compression and the secondary compression may be performed by pressing the mixture in the container using plates formed of a metal material.

The primary compression may be performed at a pressure of about 150 kgf/cm$^2$ to about 350 kgf/cm$^2$, and the primary sintering may be performed at a temperature in a range of about 100° C. to about 550° C.

The secondary compression may be performed at a pressure of about 150 kgf/cm$^2$ to about 350 kgf/cm$^2$, and the secondary sintering may be performed at a temperature in a range of about 150° C. to about 450° C.

The sputtering target may include a tin metal layer formed on a surface of the first powder material.

According to one or more embodiments, a sputtering target is fabricated by a method, where the method includes preparing a first powder material including at least one of a tin oxide and a mesh-forming oxide; mixing the first powder material and a second powder material to prepare a mixture, where the second powder material includes carbon or SnO; simultaneously performing a primary compression and primary sintering on the mixture in a reduction atmosphere; and simultaneously performing a secondary compression and secondary sintering on the mixture in the reduction atmosphere to prepare the sputtering target, where the sputtering target includes the first powder material and a tin metal layer is formed on a surface of the first powder material.

The sputtering target may further include at least one of a phosphorus oxide, a boron phosphate, a tin fluoride, a niobium oxide, a lead fluoride, a silicon oxide, a tungsten oxide, an indium oxide, a bismuth oxide, a zinc oxide, and a boron oxide.

The carbon may include at least one of carbon nanotubes, conductive carbon black powder, conductive carbon fibers, graphite, and graphene.

The electrical resistance of the sputtering target may be smaller than an electrical resistance of the first powder material.

The primary compression may be performed at a pressure of about 150 kgf/cm$^2$ to about 350 kgf/cm$^2$, the primary sintering may be performed at a temperature of about 100° C. to about 550° C., the secondary compression may be performed at a pressure of about 150 kgf/cm$^2$ to about 350 kgf/cm$^2$, the secondary sintering may be performed at a temperature of about 150° C. to about 450° C.

According to one or more embodiments, a method of manufacturing an organic light-emitting display apparatus includes forming an organic light-emitting unit on a substrate, where the organic light-emitting unit includes a lower electrode, an organic light-emitting layer, and an upper electrode; and forming a thin film encapsulation which seals the organic light-emitting unit, where the thin film encapsulation is formed by a sputtering method using a sputtering target including a first powder material, where the first powder material includes at least one of a tin oxide and a mesh-forming oxide and tin metal layer formed on a surface of the first powder material.

The sputtering target may further include at least one of a phosphorus oxide, a boron phosphate, a tin fluoride, a niobium oxide, a lead fluoride, a silicon oxide, a tungsten oxide, an indium oxide, a bismuth oxide, a zinc oxide, and a boron oxide, and the thin film encapsulation may further include at least one of a phosphorus oxide, a boron phosphate, a tin fluoride, a niobium oxide, a lead fluoride, a silicon oxide, a tungsten oxide, an indium oxide, a bismuth oxide, a zinc oxide, and a boron oxide.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Figure 1:
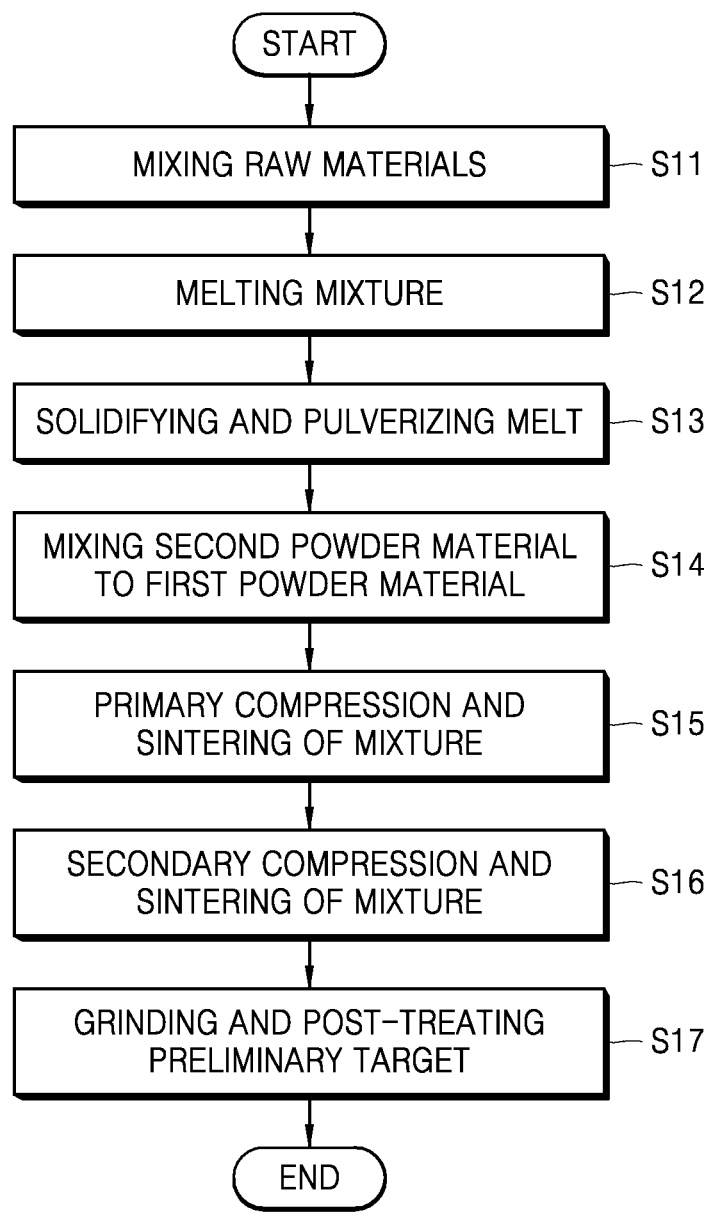
FIG. 1 is a flowchart illustrating an exemplary method of fabricating a sputtering target according to the present invention.

The invention will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
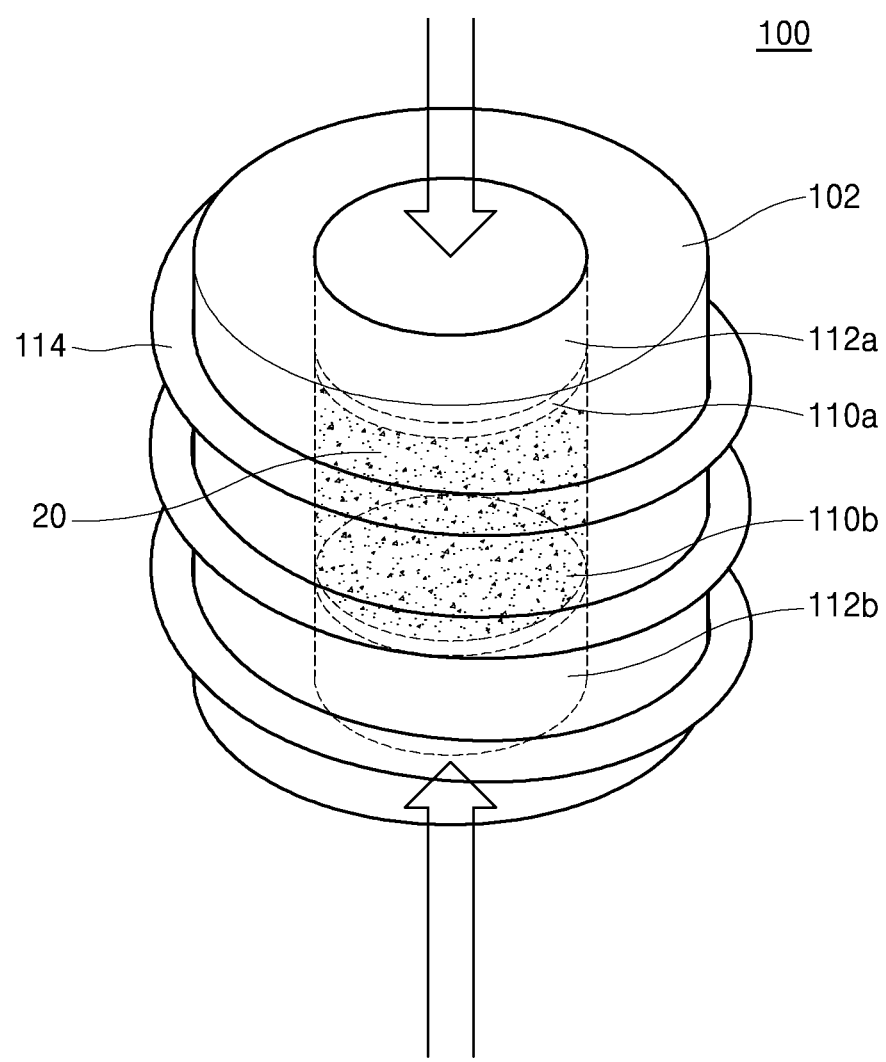
FIG. 2 is a schematic view illustrating a manufacturing apparatus used in the fabrication of the sputtering target of the present invention.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims FIG. 1 is a flowchart illustrating an exemplary method of fabricating sputtering target according to the present invention. FIG. 2 is a schematic view illustrating a manufacturing apparatus that is used in the fabrication of a sputtering target according to the present invention.

Referring to FIG. 1, the method of fabricating a sputtering target includes preparing a first powder material.

The first powder material denotes a material in the form of a powder.

The first powder material may be a low temperature viscosity transition ("LVT") inorganic material having a viscosity transition temperature at a low temperature. As used herein, the term "viscosity transition temperature" does not refer to a temperature at which the viscosity of the LVT inorganic material completely changes from "solid" to "liquid", but instead refers to the minimum temperature at which the LVT inorganic material has fluidity.

The viscosity transition temperature of the first powder material is characterized as being a temperature that is lower than the denaturation temperature of an organic light-emitting part included in an organic light-emitting display apparatus. However, when it is desirable to form a film using a material having a higher viscosity transition temperature than the transforming temperature of the organic light-emitting unit, the viscosity transition temperature of the film may be higher than the transforming temperature of the organic light-emitting part.

As used herein, the term "denaturation temperature" refers to the denaturation temperature of a material included in an organic light-emitting part 11 (FIG. 5). The denaturation temperature of a material included in an organic light-emitting part 11 refers to a temperature that causes the chemical and/or physical denaturation of a material included in the organic light-emitting part 11. For example, the denaturation temperature of a material included in an organic light-emitting part 11 may refer to the glass transition temperature (Tg) of an organic material included in an organic layer of the organic light-emitting part 11. The glass transition temperature of the organic material may be derived by performing a thermal analysis on the material included in the organic light-emitting part 11 using thermo gravimetric analysis ("TGA") and differential scanning calorimetry ("DSC"). The glass transition temperature may be, for example, about 110° C. or higher.

The LVT inorganic material may be at least one of a tin oxide or a mesh-forming oxide.

The LVT inorganic material may be formed of a compound of one type or a may be a mixture of two or more types of compounds.

In this regard, the first powder material may include at least a tin oxide (e.g., SnO or $SnO_2$) or a mesh-forming oxide (e.g., $Sn_2P_2O_7$).

Also, the first powder material may include at least one of a phosphorus oxide (e.g., $P_2O_5$), a boron phosphate ($BPO_4$), a tin fluoride (e.g., $SnF_2$), a niobium oxide (e.g., NbO or $Nb_2O_5$), a lead fluoride (e.g., $PbF_2$), a silicon oxide (e.g., $SiO_2$), a tungsten oxide (e.g., $WO_3$), an indium oxide (e.g., $In_2O_3$), a bismuth oxide (e.g., $Bi_2O_3$), a zinc oxide (e.g. ZnO), and a boron oxide (e.g., $B_2O_3$), in addition to the tin oxide or the mesh-forming oxide.

For example, the first powder material may be one of the following compounds or mixtures of compounds, but is not limited thereto:

SnO;
SnO and $P_2O_5$;
SnO and $BPO_4$;
SnO, $SnF_2$, and $P_2O_5$;
SnO, $SnF_2$, $P_2O_5$, NbO, and $Nb_2O_5$;
SnO, $SnF_2$, $P_2O_5$, and $WO_3$;
SnO and $In_2O_3$;
SnO and $Bi_2O_3$;
SnO, $P_2O_5$, and $B_2O_3$;
SnO, $P_2O_5$, and $In_2O_3$;
SnO, $P_2O_5$, $B_2O_3$, and ZnO;
SnO, $B_2O_3$, ZnO, and $SiO_2$; or
$Sn_2P_2O_7$.

For example, the first powder material may include one of the compositions below, but is not limited thereto.

1) SnO (100 mol %);
2) SnO (50 to 90 mol %) and $P_2O_5$ (10 to 50 mol %);
3) SnO (90 mol %) and $BPO_4$ (10 mol %);
4) SnO (20 to 50 mol %), $SnF_2$ (30 to 60 mol %), and $P_2O_5$ (10 to 30 mol %) (where the total of SnO, $SnF_2$, and $P_2O_5$ is 100 mol %);
5) SnO (20 to 50 mol %), $SnF_2$ (30 to 60 mol %), $P_2O_5$ (10 to 30 mol %), NbO (1 to 5 mol %) $Nb_2O_5$ (1 to 5 mol %) (where the total of SnO, $SnF_2$, $P_2O_5$, NbO, and $Nb_2O_5$ is 100 mol %);
6) SnO (20 to 50 mol %), $SnF_2$ (30 to 60 mol %), $P_2O_5$ (10 to 30 mol %), and $WO_3$ (1 to 5 mol %) (where the total of SnO, $SnF_2$, $P_2O_5$, and $WO_3$ is 100 mol %);
7) SnO (40 to 80 mol %), $P_2O_5$ (10 to 40 mol %), and $In_2O_3$ (1 to 10 mol %) (where the total of SnO, $P_2O_5$, and $In_2O_3$ is 100 mol %);
8) SnO (50 to 90 mol %) and $Bi_2O_3$ (10 to 50 mol %) (where the total of SnO and $Bi_2O_3$ is 100 mol %);
9) SnO (20 to 70 mol %), $P_2O_5$ (5 to 50 mol %), and $B_2O_3$ (5 to 50 mol %) (where the total of SnO, $P_2O_5$, $B_2O_3$ is 100 mol %);
10) SnO (20 to 70 mol %), $P_2O_5$ (5 to 50 mol %), $B_2O_3$ (5 to 50 mol %), and ZnO (5 to 20 mol %) (where the total of SnO, $P_2O_5$, $B_2O_3$, and ZnO is 100 mol %);
11) SnO (20 to 70 mol %), $B_2O_3$ (5 to 50 mol %), ZnO (5 to 20 mol %), and $SiO_2$ (5 to 20 mol %) (where the total of SnO, $B_2O_3$, ZnO, and $SiO_2$ is 100 mol %);
12) SnO (100 mol %); or 13) SnO (50 to 90 mol %) and $B_2O_3$ (10 to 50 mol %) (where the total of SnO and $B_2O_3$ is 100 mol %);

The first powder material may include SnO (42.5 mol %), SnF (40 mol %), $P_2O_5$ (15 mol %), and $WO_3$ (2.5 mol %), but is not limited thereto.

The first powder material is prepared using the method described below with reference to FIG. 1.

Referring to FIG. 1, the mixing of raw materials (S11) is performed, where a first raw material and a second raw material are mixed to prepare a raw material mixture.

The first raw material may include at least one of a tin oxide or a mesh-forming oxide. The second raw material may include at least one of a phosphorus oxide (e.g., $P_2O_5$), a boron phosphate ($BPO_4$), a tin fluoride (e.g., $SnF_2$), a niobium oxide (e.g., NbO or $Nb_2O_5$), a lead fluoride (e.g., $PbF_2$), a silicon oxide (e.g., $SiO_2$), a tungsten oxide (e.g., $WO_3$), an indium oxide (e.g., $In_2O_3$), a bismuth oxide (e.g., $Bi_2O_3$), a zinc oxide (e.g. ZnO), and a boron oxide (e.g., $B_2O_3$).

The first raw material and/or the second raw material may be in the form of a powder. The first and second raw materials are mixed together in a moisture-free environment. The second raw material, e.g., a tin fluoride or a phosphorus oxide are reactive to moisture. Thus, when the first and second raw materials are mixed in air, the second raw material absorbs moisture and thus is easily denatured. However, it is difficult to fabricate a normal sputtering target using denatured second raw material. In addition, the formation of an abnormal sputtering target may cause deposition deterioration or contamination of the deposition equipment. Therefore, it is advantageous if the mixing of the first and second raw materials is performed in a glove box where the presence of moisture is minimized or blocked.

Referring to FIG. 1, a melt is prepared by melting the raw material mixture (S12).

The raw material mixture is a LVT inorganic material and thus may be melted at a relatively low temperature. However, the melting of the raw material mixture is advantageously performed in a vacuum. For example, when the raw material mixture is melted in an environment exposed to moisture and oxygen, impurities may be formed within the melt, and thus a pure melt may not be obtained. The state of the vacuum may vary depending on a type of the raw material mixture.

Referring to FIG. 1, the process of preparing the first powder material includes solidifying and pulverizing the melt (S13).

The melt is solidified by fast cooling the melt to room temperature. Here, the technique used for fast cooling may be the same as those techniques used in the manufacture of glass. The solidified material is then pulverized by sequentially subjecting the solidified material to coarse-grinding and fine-grinding processes, and thus the first powder material is obtained.

Next, referring to FIG. 1, a mixture is prepared by mixing a second powder material with the prepared first powder material (S14). In one embodiment, the mixture includes 50 wt % to 99.9 wt % of the first powder material and 0.1 wt % to 50 wt % of the second powder material.

The first powder material includes various oxides or fluorides as well as a tin oxide or a mesh-forming oxide. Since the inorganic materials include metal cations and oxygen anions that are strongly covalent bonded, the materials are therefore insulative (e.g. non-conductive) materials having a large resistance. Therefore, when a sputtering target is fabricated using only the first powder material, the resistance of the sputtering target is too large. In other words, a sputtering target prepared using only the first powder material possesses very low levels of conductivity, and thus the charge of the sputtering target may not be more negative than the substrate. As a result, deposition through a sputtering technique may be difficult.

According to an embodiment, the second powder material is added during the fabrication of the sputtering target in order to impart low resistance to the sputtering target and to therefore provide conductivity to the sputtering target.

According to an embodiment, the second powder may include carbon or SnO. As used herein, the term "carbon" refers broadly to a carbon material which has a high melting point, is capable of stably forming a covalent bond with oxygen, nitrogen, or hydrogen, and is capable of conferring conductivity to the mixture during the mixing process. For example, the carbon may include at least one of carbon nanotubes, conductive carbon black powder, conductive carbon fibers, graphite, and graphene.

The term "carbon nanotubes" refers to carbon structures in which carbon atoms are arranged in a hexagonal, and honeycomb-like lattice structure, thus taking the form of tubes where each carbon nanotube is formed as the result of one carbon atom covalently bonding with 3 different neighboring carbon atoms. The carbon nanotubes may be single wall carbon nanotubes or multi-wall carbon nanotubes. The diameter of the carbon nanotube is several nanometers, ranging from less than 1 nanometer (nm) to up to 50 nm. The carbon nanotubes have excellent electrical conductivity.

The term "conductive carbon black powder" refers to certain types of carbon black having an excellent conductivity. The conductivity of the carbon black particles is attributable to the movement of pi electrons through a chain structure that is formed of carbon black particles.

The term "graphite" refers to a carbon material formed of flat crystals in a hexagonal plate shape or crystals in a scale or cluster-like shape. Graphite may be used as an electrical conductor.

The term "graphene" refers to a carbon material that has a two-dimensional structure having a thickness of one carbon atom including sp2 hybridized carbon atoms. Graphene is characterized as having excellent electric conductivity.

The carbon materials listed above are examples of the second powder material, but are not limited thereto.

Referring to FIG. 1, the method includes performing a primary compression and primary sintering of the mixture (S15).

As used herein, the term "compression" refers to the process of pressing the mixture together by applying a pressure. As used herein, the term "sintering" refers to the process of firmly consolidating a powdered material by heating powdered material molded in a predetermined shape.

According to an embodiment, the primary compression and sintering are performed simultaneously on the mixture several times to manufacture a preliminary target having low-resistance.

When the preliminary target is manufactured by simultaneously performing the compression and the sintering, the manufacturing time to prepare the preliminary target may be significantly reduced as compared to a technique in which the mixture is sintered after the compression has been completed.

Also, when the preliminary target is prepared using the technique of sintering after compression, the shape of the preliminary target may not be maintained, but instead may be easily shattered. However, when the technique of simultaneous compression and sintering is used, the shape of the preliminary target remains intact.

FIG. 2 illustrates a target fabrication device 100 for the preparation of a preliminary target. The target fabrication device 100 includes a container (e.g., a crucible) 102 for accommodating a mixture 20, a heating unit 114 for heating the mixture 20, and plates 112a and 112b for applying pressure to the mixture 20. Hereinafter, a method of preparing the preliminary target through the target fabrication device 100 shown in FIG. 2 will be described.

According to an embodiment, the preliminary target is prepared in a reduction atmosphere. As used herein, the term "reduction" refers to a process of discharging oxygen or a process of removing oxygen from an oxide. Thus, the term "reduction atmosphere" refers to conditions under which the process of removing oxygen present in the mixture 20 may be performed.

In the case of the target fabrication device 100, the reduction atmosphere may be formed by preparing the preliminary target in a container 102 that includes carbon. For example, the container 102 may include a carbon material selected from at least one of carbon nanotubes, conductive carbon black powder, conductive carbon fibers, graphite, and graphene. When the sintering is performed by heating the container 102 containing the mixture 20, the carbon present in the container 102 binds with oxygen atoms present in the mixture 20, and thus the reduction atmosphere is formed.

The target fabrication device 100 may include a carbon sheet 110a or 110b in contact with an upper part or a lower part of the mixture 20, respectively. The carbon sheet 110a or 110b is disposed between the plate 112a or 112b and the mixture 20, and thus the mixture 20 promotes formation of the reduction atmosphere through direct contact with carbon sheet 110a or 110b.

The sheet 110a and 110b may each be disposed in the target fabrication device 100 thereby directly contacting both the upper part and the lower part of the mixture 20 in order to form the reduction atmosphere.

Alternatively, the reduction atmosphere may be formed in the target fabrication device 100 by mixing the first powder material with the second powder material including carbon.

In this regard, the oxygen atom contributed by the tin oxide material present in the mixture binds with the carbon in the mixture, forms $CO_2$ through the reduction atmosphere, and is removed. At the same time, the Sn metal from which the oxygen is removed, forms a metal layer on the surface of the first powder material. The deposition of the Sn metal on the surface of the first powder material reduces the resistance of the sputtering target.

When carbon is used as the second powder material, the oxygen included in the first powder material may be removed by binding to the carbon, and thus the carbon sheet 110a or 110b in the target fabrication device 100 shown in FIG. 2 may be omitted. However, when tin oxide (SnO) is used as the second powder material, the carbon sheet 110a or 110b is necessary for direct contact with the mixture 20 in the target fabrication device 100 in order to efficiently remove the oxygen included in the mixture 20.

As described above, when the compression and sintering are simultaneously performed on the mixture 20, a strongly consolidated preliminary target may be prepared without adding a binder material. When a binder material is used to fabricate a strongly consolidated preliminary target, the binder may function as an impurity in a thin film on which the binder is deposited, resulting in decreased transmission and purity of the thin film. Also, although a separate binder disassembling process is used to remove the binder, the binder may not be completely removed even when the binder disassembling process is performed. However, when a sputtering target is fabricated without using a binder, the target may not be consolidated, and as a result, the shape of the target may not be maintained, but instead may be easily shattered.

In an embodiment, when the preliminary target is prepared in the reduction atmosphere according to the present invention, a strongly consolidated sputtering target is prepared by simultaneously performing compression and sintering and depositing a thin film without any impurities, and without the need for an additional binder material.

The primary sintering process is performed on the mixture 20 at a temperature in a range from about 100° C. to about 550° C. A high frequency induction heating technique may be used for the sintering. The term "high frequency induction heating" refers to the technique of heating a heat-receiving conductor with dissipative heat by placing the conductor in a coil, flowing a high frequency wave thereto, and generating an eddy current near a surface of the conductor.

Referring to the target fabrication device 100 shown in FIG. 2, the heating unit 114 in the form of a coil is disposed on an external surface of the container 102. The mixture 20 contained in the container 102 is heated as the container 102 is heated by flowing high frequency waves to the heating unit 114. When the container 102 is heated using the high frequency induction heating technique, heat is more evenly transferred to the mixture 20 as compared to other heating techniques which may be used, and as a result, the uniformity of the surface and the internal portion of the preliminary target may be improved.

The primary compression process may be performed at a pressure in a range from about 150 kilogram force per square centimeter ($kgf/cm^2$) to about 350 $kgf/cm^2$. The plates 112a and 112b are used in the compression process.

Referring to the target fabrication device 100 shown in FIG. 2, each of the plates 112a and 112b are respectively disposed on an upper surface and a lower surface of the container 102. The container 102 has a cylindrical shape, and as the gap between the two plates 112a and 112b is narrowed, the mixture disposed between the two plates 112a and 112b is compressed.

As shown in FIG. 2, the mixture 20 may be pressed from both directions, but is not limited thereto, and thus the mixture 20 may be pressed from a single direction. The plates 112a and 112b may be formed of a material having a high thermal conductivity and high resistance to corrosion. For example, plates 112a and 112b may be formed of stainless steel (SUS). However, other suitable materials may also be used to form the plates 112a and 112b.

Referring to FIG. 1, the process further includes performing a secondary compression and a secondary sintering of the mixture (S16) to prepare a preliminary target.

The secondary sintering process is performed at a high temperature in a range from about 150° C. to about 450° C. High frequency induction heating techniques may be used for the secondary sintering as described above.

The secondary compression process may be performed at a pressure in a range from about 150 $kgf/cm^2$ to about 350 $kgf/cm^2$. The plates 112a and 112b may be used in the secondary compression process.

The secondary compression and second sintering with respect to the mixture 20 are performed simultaneously in the same manner as the primary sintering and primary compression were simultaneously performed.

Table 1 below shows exemplary processing times used for the primary sintering/primary compression process and the secondary sintering/secondary compression process in order to fabricate a sputtering target.

Referring to Table 1, the temperature increasing time (i.e. the time during which the temperature is increased from ambient temperature to the desired final temperature) for the primary sintering/compression process occurs over a period of about one hour and the maximum temperature is maintained for about 0.5 hour to about 2 hours. For the secondary sintering/compression process the temperature increasing time occurs over a period of about 0.5 hour to about 2 hours and the maximum temperature is maintained for about 0.5 hour to about 2 hours. The pressure used in each of the primary sintering/compression process and the secondary sintering/compression process may be maintained constant within a range set for the processing time.

In one embodiment, in order to fabricate a sputtering target, a total time of about 6 hours or less is consumed. Thus, the simultaneous sintering process and the compression process significantly reduce the processing time for manufacturing a sputtering target.

TABLE 1

| Primary sintering/compression process | | Secondary sintering/compression process | |
| --- | --- | --- | --- |
| Temperature increasing time | Maintaining time | Temperature increasing time | Maintaining time |
| 1 hr | 0.5 to 2 hrs | 0.2 to 0.5 hrs | 0.5 to 2 hrs |

Table 2 below shows the density and resistance of a sputtering target fabricated according to the exemplary embodiment of FIG. 1.

Referring to Table 2, the primary sintering/compression process and the secondary sintering/compression process are conducted at different temperatures. Thus a sputtering target having a density of about 89.8% of a theoretical density and a resistance of 10 Ohms ($\Omega$) may be manufactured.

TABLE 2

| Primary sintering/compression process | | Secondary sintering/compression process | | Sputtering target | |
| --- | --- | --- | --- | --- | --- |
| Temperature | Pressure | Temperature | Pressure | Density | Resistance |
| 350° C. | 290 kgf/cm$^2$ | 450° C. | 290 kgf/cm$^2$ | 89.8% | 10 $\Omega$ |

As illustrated in FIG. 1, the preliminary target is subjected to a grinding and post-treating (S17) in which the preliminary target is polished and post-processed to manufacture a sputtering target. In detail, the surface of the preliminary target is polished, impurities are removed therefrom, and the preliminary target is attached to the backing plate of a sputtering apparatus, thereby completing the manufacture of the sputtering target.

According to an embodiment, the manufacture of the sputtering target includes mixing the second powder material and the first powder material and performing several rounds of sintering and compression in order to make the sputtering target having low-resistance and to confer conductivity to the sputtering target. By mixing the first and the second powder material, a tin metal layer is formed on the first powder material, and thus the resistance of the sputtering target may be reduced. Also, by performing several rounds of sintering and compression, the density of the preliminary target is increased and the resistance of the target is reduced, and thus the conductivity of the sputtering target is increased.

Figure 3:
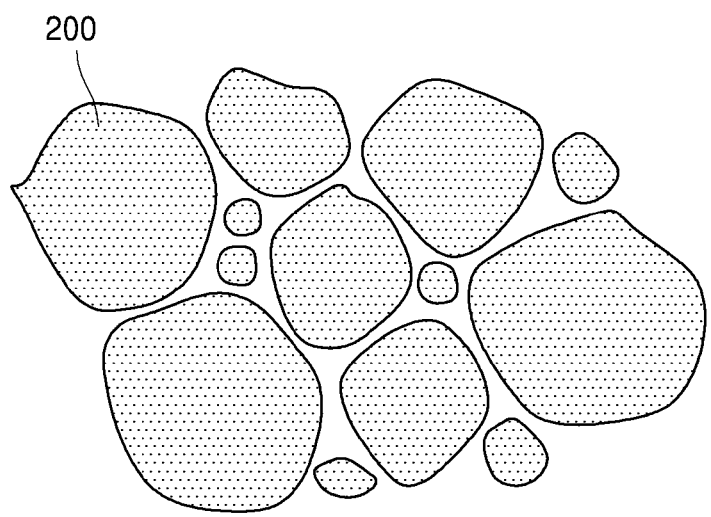
FIG. 3 is a schematic cross-sectional view of an exemplary first powder material according to the present invention.
Figure 4:
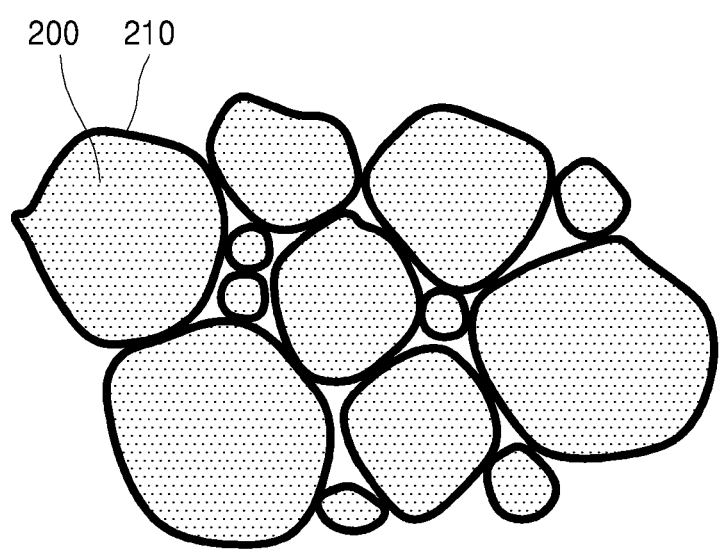
FIG. 4 is a schematic cross-sectional view of a metal layer formed on a surface of the first powder material after compressing and calcining a mixture of the first powder material and a second powder material.

FIG. 3 is an illustration of a cross-section of the exemplary first powder material. FIG. 4 is an illustration of a cross-section of the first powder material showing the metal layer that is formed on a surface of the first powder material after performing compression and sintering on the mixture of the first powder material and the second powder material.

Referring to FIGS. 3 and 4, in the reduction atmosphere of the target fabrication device 100 (see FIG. 2), oxygen present in the first powder material 200 (e.g. tin oxide) is removed, and the tin metal 210, from which the oxygen has been removed, forms a metal layer on a surface of the first powder material 200.

As described above, according to one or more embodiments, a sputtering target having low-resistance and conductivity may be fabricated. Thus, the sputtering target has a charge more negative than the substrate, and a thin film including a LVT inorganic material may be deposited by using a sputtering method.

Figure 5A:
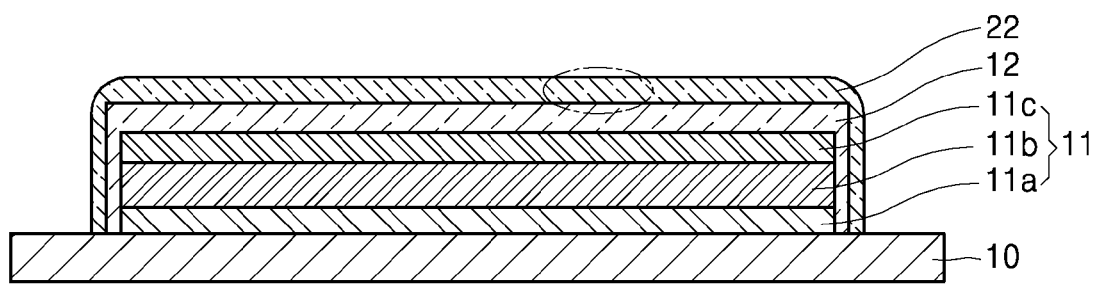
FIG. 5A is an illustration of an exemplary embodiment of an organic light-emitting display apparatus formed using the sputtering target fabricated according to the present invention.

FIG. 5A is a view schematically illustrating an organic light-emitting display apparatus including a thin film encapsulation formed using the sputtering target that is fabricated as described herein.

Referring to FIG. 5A, the organic light-emitting display apparatus includes an organic light-emitting unit 11 formed on a substrate 10. The organic light-emitting unit 11 has a structure that includes a lower electrode 11a, an organic light emitting layer 11b, and an upper electrode 11c stacked on the substrate 10. Also, the organic light-emitting unit 11 may further include a protection layer 12 formed of an inorganic material.

The organic light-emitting unit 11 emits light from the organic light-emitting layer 11b. The organic light-emitting layer is formed of an organic material, however the organic material may be easily degraded by moisture and oxygen. Thus, sealing the organic light-emitting unit 11 from moisture and oxygen is important to improve the reliability of the organic light-emitting display apparatus.

Figure 5B:
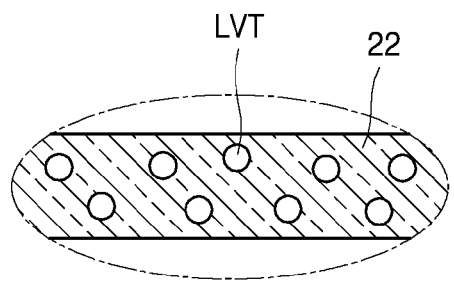
FIG. 5B is an enlarged view of a cross-section of the thin film encapsulation 12 formed on the organic light-emitting display apparatus.

The organic light-emitting unit 11 may be sealed with a thin film encapsulation 22. FIG. 5B is an enlarged view of a cross-section of the thin film encapsulation 22. The thin film encapsulation 22 may include a LVT inorganic material. In this case, the thin film encapsulation 22 may be formed using a sputtering method and using the sputtering target fabricated in the method shown in FIG. 1.

The thin film encapsulation 22 may only include a first powder material (LVT), and therefore when the sputtering target includes a tin oxide or a mesh-forming oxide, the thin film encapsulation 22 also includes a tin oxide or a mesh-forming oxide. If the sputtering target includes at least one of a phosphorus oxide, a boron phosphate, a tin fluoride, a niobium oxide, a lead fluoride, a silicon oxide, a tungsten oxide, an indium oxide, a bismuth oxide, a zinc oxide, and a boron oxide, in addition to a tin oxide or a mesh-forming oxide, the thin film encapsulation 22 will also include these same materials.

It should be understood that the exemplary embodiments described therein should be considered in a descriptive sense only and not for purposes of limitation. Descriptions of features or aspects within each embodiment should typically be considered as available for other similar features or aspects in other embodiments. While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a sputtering target, the method comprising:

preparing a first powder material comprising at least one of a tin oxide and $Sn_2P_2O_7$;

mixing the first powder material and a second powder material to prepare a mixture, wherein the second powder material comprises carbon or a tin oxide;

simultaneously performing a primary compression and a primary heating on the mixture in a reduction atmosphere; and simultaneously performing a secondary compression and a secondary heating on the mixture in the reduction atmosphere to prepare the sputtering target, wherein the primary heating is performed at a temperature of about 100° C. to about 550° C. and the secondary heating is performed at a temperature of about 150° C. to about 450° C.

2. The method of claim 1, wherein the preparing of the first powder material further comprises:

preparing a raw material mixture by mixing a first raw material and a second raw material in a moisture-free environment, wherein the first raw material comprises at least one of the tin oxide and the $Sn_2P_2O$, and the second raw material comprises at least one of a phosphorus oxide, a boron phosphate, a tin fluoride, a niobium oxide, a lead fluoride, a silicon oxide, a tungsten oxide, an indium oxide, a bismuth oxide, a zinc oxide, and a boron oxide;

melting the raw material mixture in a vacuum to prepare a melt;

solidifying and pulverizing the melt to prepare the first powder material.

3. The method of claim 1, wherein the second powder material comprises carbon, and wherein the carbon comprises at least one of carbon nanotubes, conductive carbon black powder, conductive carbon fibers, graphite, and graphene.

4. The method of claim 1, wherein the mixture comprises 50 wt % to 99.9 wt % of the first powder material and 0.1 wt % to 50 wt % of the second powder material.

5. The method of claim 1, wherein the reduction atmosphere is formed by contacting a carbon sheet with the mixture, wherein contact between the carbon sheet and the mixture occurs in an upper part or a lower part of the mixture.

6. The method of claim 1, wherein the reduction atmosphere is formed in a container comprising the mixture, and wherein the container further comprises carbon.

7. The method of claim 6, wherein the primary heating and the secondary heating are performed as the container is heated using an induction heating technique.

8. The method of claim 6, wherein the primary compression and the secondary compression are performed by pressing the mixture in the container using plates formed of a metal material.

9. The method of claim 1, wherein the primary compression is performed at a pressure of about 150 kgf/cm$^2$ to about 350 kgf/cm$^2$.

10. The method of claim 1, wherein the secondary compression is performed at a pressure of about 150 kgf/cm$^2$ to about 350 kgf/cm$^2$.

11. The method of claim 1, wherein the sputtering target comprises a tin metal layer formed on a surface of the first powder material.

12. The method of claim 1, wherein the first powder material comprises at least one of $Sn_2P_2O_7$; SnO and $P_2O_5$; SnO and $BPO_4$; SnO, $SnF_2$, and $P_2O_5$; SnO, $SnF_2$, $P_2O_5$, NbO, and $Nb_2O_5$; SnO, $SnF_2$, $P_2O_5$, and $WO_3$; SnO and $Bi_2O_3$; SnO, $P_2O_5$, and $B_2O_3$; SnO, $P_2O_5$, and $In_2O_3$; SnO, $P_2O_5$, $B_2O_3$, and ZnO; and SnO, $B_2O_3$, ZnO, and $SiO_2$.

* * * * *